US010399170B2

(12) United States Patent
Lam et al.

(10) Patent No.: US 10,399,170 B2
(45) Date of Patent: Sep. 3, 2019

(54) DIE ATTACHMENT APPARATUS AND METHOD UTILIZING ACTIVATED FORMING GAS

(71) Applicants: Kui Kam Lam, Kwai Chung (HK); Pingliang Tu, Kwai Chung (HK); Zhao Yang, Chengdu (CN); Jun Qi, Chengdu (CN); Chun Hung Samuel Ip, Kwai Chung (HK)

(72) Inventors: Kui Kam Lam, Kwai Chung (HK); Pingliang Tu, Kwai Chung (HK); Zhao Yang, Chengdu (CN); Jun Qi, Chengdu (CN); Chun Hung Samuel Ip, Kwai Chung (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 14/141,767

(22) Filed: Dec. 27, 2013

(65) Prior Publication Data

US 2015/0072473 A1 Mar. 12, 2015

(30) Foreign Application Priority Data

Sep. 11, 2013 (CN) .......................... 2013 1 0410954

(51) Int. Cl.
*B23K 3/08* (2006.01)
*B23K 1/00* (2006.01)
(Continued)

(52) U.S. Cl.
CPC ............ *B23K 3/082* (2013.01); *B23K 1/0016* (2013.01); *B23K 1/206* (2013.01); *B23K 3/063* (2013.01);
(Continued)

(58) Field of Classification Search
CPC ..... H01L 2224/7501; H01L 2224/7801; H01L 2021/60052; H01L 24/742; H01L 24/75; B23K 1/206
(Continued)

(56) References Cited

U.S. PATENT DOCUMENTS 4,379,218 A * 4/1983 Grebe .................... B23K 1/005 219/121.14
4,863,561 A * 9/1989 Freeman ........... H01L 21/02046 134/1
(Continued)

FOREIGN PATENT DOCUMENTS

CN 1030659897 A 4/2013
JP S55-33080 3/1980
(Continued)

OTHER PUBLICATIONS

Japanese Office Action, dated Dec. 5, 2016, issued in corresponding Japanese Patent Application No. 2014-177708. English translation. Total 7 pages.
(Continued)

*Primary Examiner* — David A Zarneke
(74) *Attorney, Agent, or Firm* — Ostrolenk Faber LLP

(57) ABSTRACT

A die attachment apparatus for attaching a semiconductor die onto a substrate having a metallic surface comprises a material dispensing station for dispensing a bonding material onto the substrate and a die attachment station for placing the semiconductor die onto the bonding material which has been dispensed onto the substrate. An activating gas generator positioned before the die attachment station introduces activated forming gas onto the substrate in order to reduce oxides on the substrate.

18 Claims, 5 Drawing Sheets

(51) Int. Cl.

| | |
|---|---|
| ***B23K 1/20*** | (2006.01) |
| ***B23K 3/06*** | (2006.01) |
| ***H01L 23/00*** | (2006.01) |
| ***H01L 21/60*** | (2006.01) |
| ***B23K 101/42*** | (2006.01) |

(52) U.S. Cl.
CPC ................ *B23K 3/08* (2013.01); *H01L 24/75* (2013.01); *B23K 2101/42* (2018.08); *H01L 24/742* (2013.01); *H01L 24/83* (2013.01); *H01L 2021/60052* (2013.01); *H01L 2224/2733* (2013.01); *H01L 2224/291* (2013.01); *H01L 2224/32245* (2013.01); *H01L 2224/7501* (2013.01); *H01L 2224/7565* (2013.01); *H01L 2224/7801* (2013.01); *H01L 2224/83192* (2013.01); *H01L 2224/83815* (2013.01)

(58) Field of Classification Search
USPC ....................... 438/613; 156/345.35, 345.33; 228/180.22
See application file for complete search history.

(56) References Cited

U.S. PATENT DOCUMENTS

| | | | | | |
|---|---|---|---|---|---|
| 5,000,819 | A * | 3/1991 | Pedder | B23K 1/206 | 134/1 |
| 5,090,609 | A * | 2/1992 | Nakao | H01L 21/4853 | 228/123.1 |
| 5,192,582 | A * | 3/1993 | Liedke | B23K 1/008 | 118/50 |
| 5,345,056 | A * | 9/1994 | Frei | B23K 1/012 | 219/121.43 |
| 5,409,543 | A * | 4/1995 | Panitz | B23K 1/20 | 134/2 |
| 5,492,265 | A * | 2/1996 | Wandke | B23K 1/0016 | 228/205 |
| 5,499,754 | A * | 3/1996 | Bobbio | B23K 1/20 | 228/42 |
| 5,722,581 | A * | 3/1998 | Sindzingre | B23K 1/20 | 228/206 |
| 5,735,451 | A * | 4/1998 | Mori | B23K 1/012 | 228/206 |
| 5,831,238 | A * | 11/1998 | Takuya | B23K 1/203 | 219/121.41 |
| 5,941,448 | A * | 8/1999 | Sindzingre | B23K 1/203 | 134/1.1 |
| 6,089,445 | A * | 7/2000 | Sindzingre | B23K 1/203 | 228/179.1 |
| 6,227,436 | B1 * | 5/2001 | Nishikawa | B23K 1/0016 | 219/121.68 |
| 6,250,540 | B1 * | 6/2001 | Egitto | B23K 1/206 | 219/85.21 |
| 6,375,060 | B1 * | 4/2002 | Silhavy | B23K 1/008 | 228/180.22 |
| 6,468,833 | B2 * | 10/2002 | Uner | B23K 1/206 | 134/1.1 |
| 6,607,613 | B2 * | 8/2003 | Egitto | B23K 1/206 | 148/400 |
| 6,713,401 | B2 * | 3/2004 | Yokogawa | H01J 37/32192 | 156/345.33 |
| 6,734,102 | B2 * | 5/2004 | Rathi | B08B 7/0035 | 134/1.1 |
| 6,737,812 | B2 * | 5/2004 | Yuasa | H01J 37/32192 | 156/345.33 |
| 6,756,560 | B2 * | 6/2004 | Barnett | B23K 10/022 | 219/121.45 |
| 6,902,774 | B2 * | 6/2005 | Nicolussi | H01J 37/32009 | 156/272.6 |
| 6,977,229 | B2 * | 12/2005 | Yokogawa | H01L 21/0206 | 257/E21.226 |
| 7,014,887 | B1 * | 3/2006 | Cohen | B08B 7/0035 | 134/1.1 |
| 7,079,370 | B2 * | 7/2006 | Dong | B08B 7/00 | 361/230 |
| 7,387,738 | B2 * | 6/2008 | Dong | B23K 1/008 | 205/640 |
| 7,604,708 | B2 * | 10/2009 | Wood | C23C 14/022 | 118/715 |
| 8,006,975 | B2 * | 8/2011 | Muller | B65H 5/24 | 198/418.9 |
| 8,361,340 | B2 * | 1/2013 | Dong | B23K 1/008 | 204/230.2 |
| 8,567,658 | B2 * | 10/2013 | Schulte | H01L 24/11 | 228/116 |
| 9,053,894 | B2 * | 6/2015 | Dong | B23K 1/20 | |
| 9,132,496 | B2 * | 9/2015 | Diep | B23K 1/0016 | |
| 2002/0034581 | A1 * | 3/2002 | Farrar | B23K 3/0607 | 427/58 |
| 2002/0195202 | A1 * | 12/2002 | Arita | C23C 16/45568 | 156/345.33 |
| 2003/0176069 | A1 * | 9/2003 | Yuasa | H01J 37/32192 | 438/692 |
| 2003/0192645 | A1 * | 10/2003 | Liu | C23C 16/455 | 156/345.33 |
| 2005/0051521 | A1 * | 3/2005 | Shindo | B23K 1/0016 | 219/121.64 |
| 2012/0111925 | A1 * | 5/2012 | Diep | B23K 1/0016 | 228/178 |
| 2012/0237693 | A1 * | 9/2012 | Jackson | C23C 16/4405 | 427/534 |

FOREIGN PATENT DOCUMENTS

| | | |
|---|---|---|
| JP | 2002-001253 A | 1/2002 |
| JP | 2004-111607 | 4/2004 |
| JP | 2008-004722 A | 1/2008 |
| KR | 10-2008-0112655 | 12/2008 |
| WO | WO 2007/148836 A2 | 12/2007 |

OTHER PUBLICATIONS

Japanese Office Action dated Jul. 3, 2017 issued in corresponding Japanese Patent Application No. 2014-177708 with English translation.

* cited by examiner

DIE ATTACHMENT APPARATUS AND METHOD UTILIZING ACTIVATED FORMING GAS

FIELD OF THE INVENTION

The invention relates to the attachment of semiconductor chips or dice onto substrates, and in particular, to the treatment of substrates and/or a die attachment medium prior to such attachment.

BACKGROUND AND PRIOR ART

The manufacturing of electronic devices often involves the attachment of a semiconductor die onto a substrate prior to final packaging of the electronic devices. Before a semiconductor die is attached to the substrate having a metallic surface, such as a lead frame, the substrate or lead frame is typically pre-heated in a heat tunnel in order to create conditions which are conducive to die attachment. The heat tunnel has heaters to pre-heat the lead frame to a temperature above the melting point of soft solder to enable the solder to become the medium for die attachment. Solder may be dispensed by way of a length of solder wire that is lowered onto a pre-heated lead frame and which melts upon contact with the pre-heated lead frame. The lead frame is then transported to a bonding zone within the heat tunnel whereat the semiconductor die is bonded. Finally, the lead frame is cooled to solidify the solder to complete the bond. Conventional soft solder die attach applications employ forming gases, which may contain 5-15% hydrogen, to impede oxidation of the lead frame during such heating process.

Fluxless soldering is the most preferred method for die attachment and is widely used in industry. Amongst various fluxless reflow and soldering methods, the use of hydrogen as a reactive gas to reduce oxides on substrates is especially attractive because it is a clean process and is compatible with an open and continuous production line. Therefore, fluxless soldering which is carried out in the presence of hydrogen has been a technical goal for a long time. One approach has been to employ forming gas comprising 5-15% hydrogen in a nitrogen carrier gas to exhaust air, especially oxygen, from the heat tunnel. The oxygen level in the heat tunnel is maintained at below 50 ppm to protect the lead frame from oxidation. Furthermore, the forming gas can be used to reduce copper oxide that is present on the surface of the lead frame to improve solder wettability.

The heat tunnel would usually be full of the forming gas mentioned above. However, for soldering processes used in die attachment, a major limitation is the inefficient and slow reduction rate of metal oxides, especially in respect of solder oxides. This inefficiency of hydrogen is attributable to the lack of reactivity of hydrogen molecules at low temperatures. While active hydrogen is important for reducing oxide, highly reactive radicals such as mono-atomic hydrogen can be formed only at high temperatures. For instance, the effective temperature range for reducing copper oxide is above 350° C., and even higher temperatures (of more than 450° C.) are necessary to effectively reduce solder oxide. Usually, relatively limited amounts of hydrogen gas can be activated in a conventional heat tunnel of a soft solder die bonder. Therefore, it would be desirable to be able to generate highly reactive hydrogen, and thus decrease the required amounts of hydrogen concentration and processing temperature for effective reduction of oxides such as solder oxide.

Moreover, due to several open windows in the heat tunnel for process operations, such as solder dispensing, spanking and die bonding, air often diffuses and blows as a tourbillion into the heat tunnel. This makes it challenging to achieve an oxygen-free environment in the heat tunnel in order to achieve a high level of anti-oxidation for good soldering. Without effective reduction of solder oxide, the solder oxide which is created will result in void and die tilting issues during die attachment, and would induce reliability problems.

A further negative trend is that more and more low-end lead frames with degraded solder wettability are being used. These lead frames are more prone to copper oxide formation on their surfaces, which prove challenging when using traditional forming gas to impede oxidation.

For the above reasons, the effectiveness of the reducing gases that have been conventionally used should be improved.

SUMMARY OF THE INVENTION

It is thus an object of the invention to seek to use an active reducing gas in a solder die-attach environment to avoid at least some of the shortcomings of the aforesaid conventional die attachment apparatus.

It is another object of the invention to seek to achieve a simpler reactivating technique as compared to the prior art, in order to improve the speed and effectiveness of the reduction process.

According to a first aspect of the invention, there is provided a die attachment apparatus for attaching a semiconductor die onto a substrate having a metallic surface, the apparatus comprising: a material dispensing station for dispensing a bonding material onto the substrate; a die attachment station for placing the semiconductor die onto the bonding material which has been dispensed onto the substrate; and an activating gas generator positioned before the die attachment station for introducing activated forming gas onto the substrate, the activated forming gas being operative to reduce oxides on the substrate.

According to a second aspect of the invention, there is provided a method of attaching a semiconductor die onto a substrate having a metallic surface, comprising the steps of: introducing activated forming gas onto the substrate with an activating gas generator for reducing oxides on the substrate; dispensing a bonding material onto the substrate at a material dispensing station; and thereafter placing the semiconductor die onto the bonding material which has been dispensed onto the substrate at a die attachment station.

According to a third aspect of the invention, there is provided a method of manufacturing an electronic device comprising a substrate having a metallic surface, comprising the steps of: introducing activated forming gas onto the substrate with an activating gas generator for reducing oxides on the substrate; dispensing a bonding material onto the substrate at a material dispensing station; and thereafter placing the semiconductor die onto the bonding material which has been dispensed onto the substrate at a die attachment station.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

Examples of apparatus and processes for conducting die attachment with reduced oxidation in accordance with the invention will now be described with reference to the accompanying drawings, in which.

DETAILED DESCRIPTION OF THE PREFERRED EMBODIMENTS OF THE INVENTION

Figure 1:
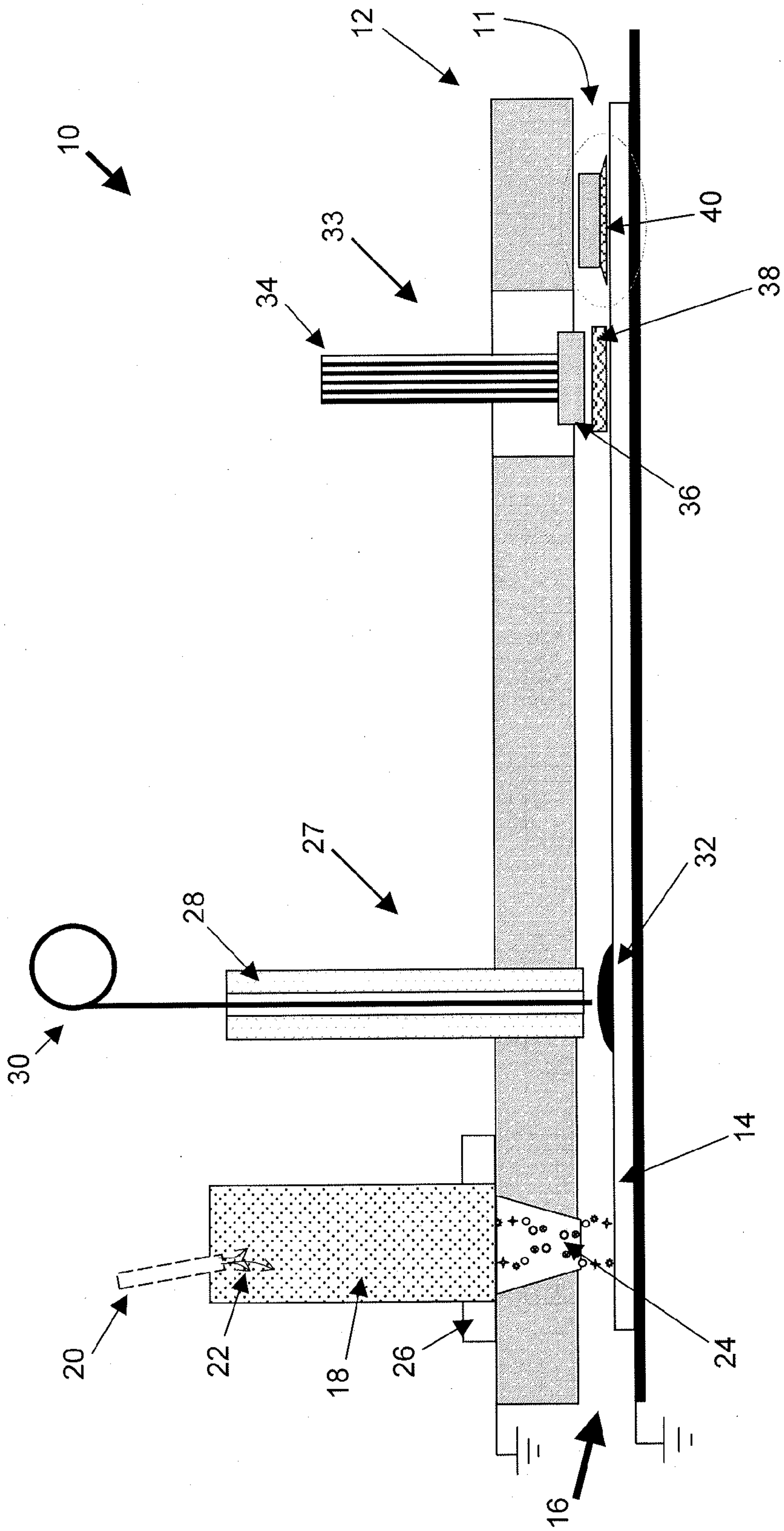
FIG. 1 is a sectional view of a soft solder die attachment apparatus using activated forming gas in accordance with a first preferred embodiment of the invention.

FIG. 1 is a sectional view of a die attachment apparatus 10 using activated forming gas 22 in accordance with a first preferred embodiment of the invention. Although the process described herein relates to the use of soft solder, it should be appreciated that the die attachment apparatus 10 may also be suitable for other modes of die attachment which do not make use of soft solder.

The die attachment apparatus 10 comprises a heat tunnel cover 12 which closes a heat tunnel 11 through which a substrate 14 having a metallic surface, such as a lead frame, is configured to be conveyed for the attachment of semiconductor dice 36 to the substrate 14. Shielding gas 16, which may be nitrogen or forming gas, is introduced into and fills a passageway of the heat tunnel 11 to envelope the substrate 14 contained in the heat tunnel 11 and protects components located inside the passageway from oxidation when the substrate 14 is undergoing processing. The die attachment apparatus 10 has at least one heater to heat the substrate 14 up to a temperature of about 30-80° C. higher than a melting point of the soft solder used, so that the soft solder will melt upon contact with the substrate 14.

An activating gas generator 18 is positioned over an opening in the heat tunnel cover 12 for projecting activated forming gas through the opening into the heat tunnel 11 and onto the substrate 14 to reduce oxides on the substrate 14. The activated forming gas is introduced primarily to clean the substrate 14 prior to soldering, and it is also operable to deoxidize a soft solder attachment medium before bonding a semiconductor die onto the same, as discussed below. Alternatively, the activating gas generator 18 may be integrated directly onto the heat tunnel cover 12. A gas supply tube 20 is coupled to the activating gas generator 18 for supplying forming gas 22 which has been excited at atmospheric pressure.

The forming gas 22 has been activated to create activated species or excited radicals, and hydrogen ions. Activated forming gas 24 and in particular the excited radicals found in the forming gas act on the pre-heated substrate 14 to reduce oxides. A slidable cover 26 closes a gap between the activating gas generator 18 and the heat tunnel cover 12 for minimizing the loss of shielding gas 16 and activated forming gas 24 from the heat tunnel 11 passageway.

A material dispensing station 27 is located downstream of the activating gas generator 18 for dispensing a bonding material. In the described embodiment, bonding material in the form of soft solder is dispensed onto the substrate 14. At the material dispensing station 27, a wire dispenser 28 introduces a length of solder wire 30 for dispensing solder onto the substrate 14 when the solder wire 30 melts upon contact with the substrate 14 to form a solder dot 32. Alternatively, the wire dispenser 28 may also produce a solder pattern. After the solder dot 32 has been dispensed onto the substrate 14, the substrate 14 having the solder dot 32 on it is transported to a die attachment station 33 by an indexer (not shown). A bond tool 34 located at the die attachment station 33 picks up and places a semiconductor die 36 onto the solder dot 32 which has been dispensed onto the substrate 14. Finally, the semiconductor die 36 along with bonding solder 38 from the solder dot 32 are cooled to solidify the bond between the semiconductor die 36 and the substrate 14. The substrate 14 and bonded semiconductor die 36 are then packaged into an electronic device.

Figure 2:
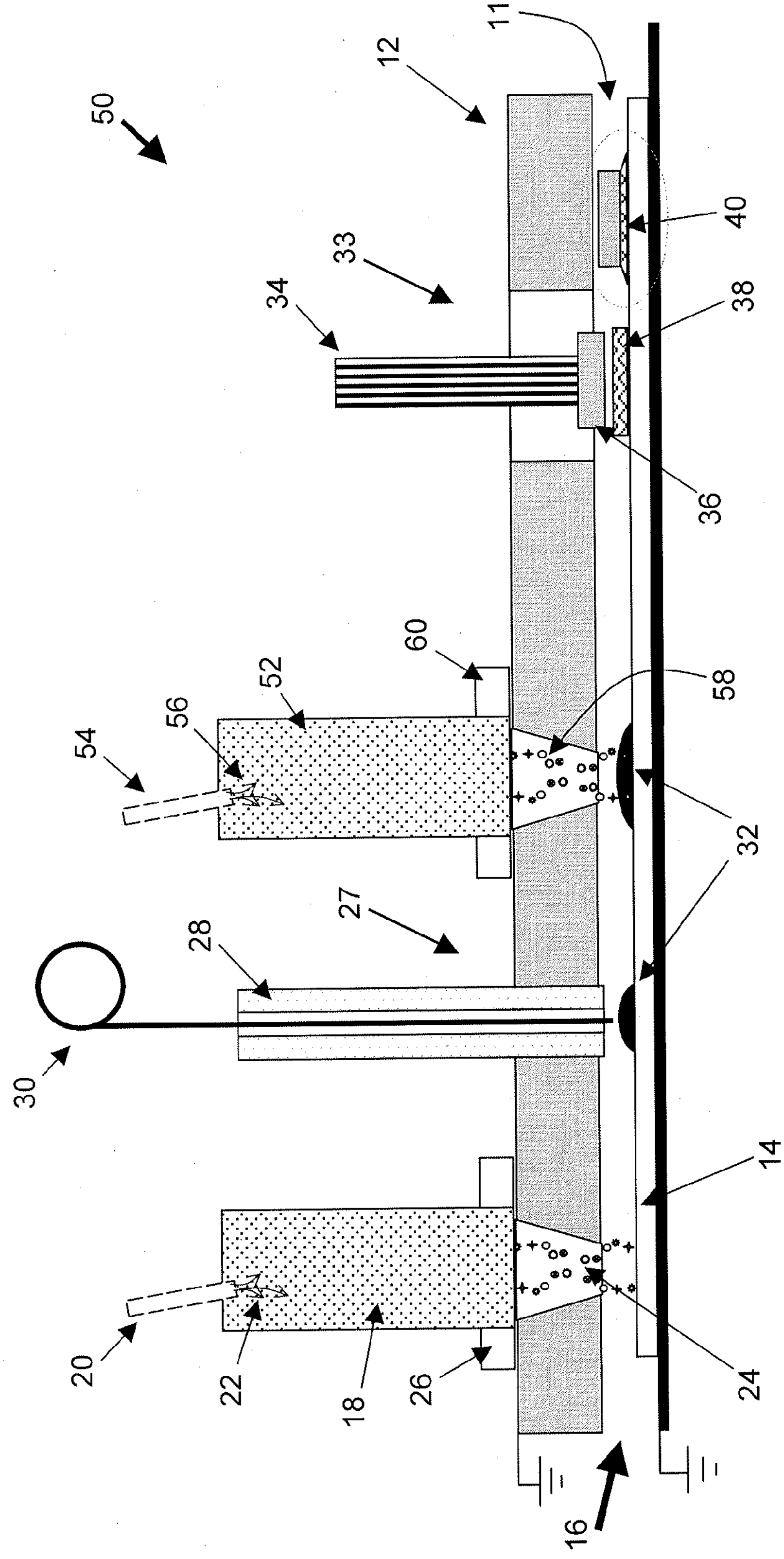
FIG. 2 is a sectional view of a soft solder die attachment apparatus using activated forming gas in accordance with a second preferred embodiment of the invention.

FIG. 2 is a sectional view of a die attachment apparatus 50 using activated forming gas in accordance with a second preferred embodiment of the invention. In this embodiment, in addition to a first activating gas generator 18 positioned before the wire dispenser 28, a second activating gas generator 52 is positioned over another opening in the heat tunnel cover 12 located between the wire dispenser 28 and the bond tool 34. The second activating gas generator 52 further comprises a second gas supply tube 54, for supplying forming gas 56 which has been excited at atmospheric pressure, and a slidable cover 60 which closes a gap between the second activating gas generator 52 and the heat tunnel cover 12 to minimize the loss of shielding gas 16 and activated forming gas 58 from the heat tunnel 11 passageway.

Whilst the first activating gas generator 18 is operative to reduce oxides on the substrate 14 at least at a location on the substrate 14 where an amount of solder is dispensed (as well as on other parts of the substrate 14), the second activating gas generator 52 is operative to primarily reduce oxides on the amount of solder that has been dispensed onto the substrate 14. Specifically, the second activating gas generator 52 is primarily operative to reduce any solder oxide formed on the dispensed solder dot 32 or solder pattern which has been introduced onto substrate 14 at the position of the wire dispenser 28.

That is to say, two activating gas generators 18, 52 installed both before and after the wire dispenser 28 to reduce oxides on the substrate 14 and the solder dot 32 respectively are employed in this embodiment of the die attachment apparatus 50. During the die attach process, after the substrate 14 has been heated to a predetermined temperature, any oxides on the substrate 14 are reduced by activated forming gas from the first activating gas generator 18. After the solder dot 32 has been dispensed onto the substrate 14, the solder oxide present on the solder dot 32 or solder pattern is reduced by the second activating gas generator 52 before a semiconductor die 36 is placed onto the solder dot 32 or solder pattern. Thereafter, the bonded solder 38 is cooled to bond the semiconductor die 36 securely to the substrate 14. A good die bond can be achieved since the solder is clean and wets well.

Figure 3:
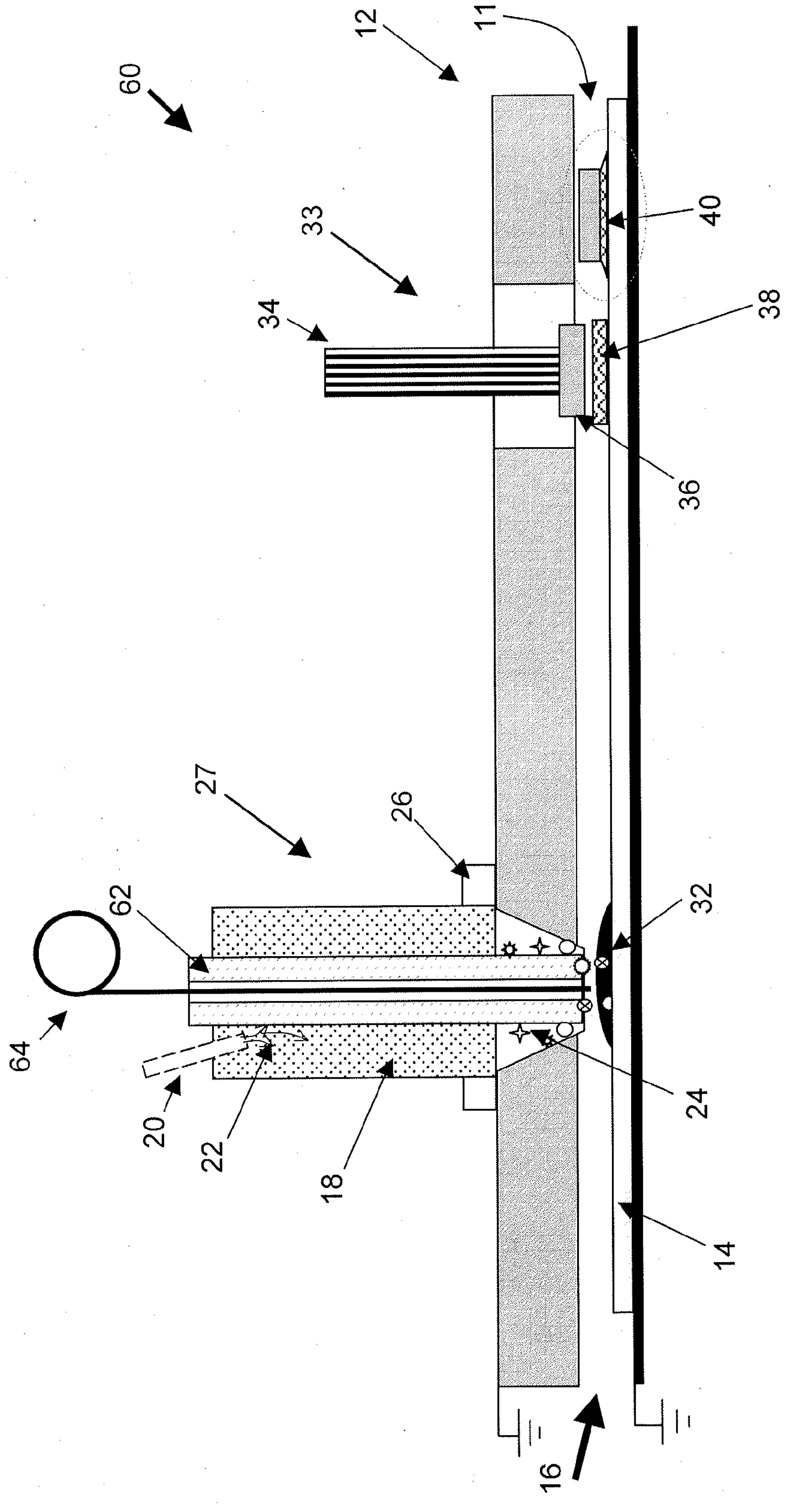
FIG. 3 is an enlarged view of a portion of a die attachment apparatus according to a third preferred embodiment of the invention, wherein an activating gas generator is installed onto a wire dispenser.

In another preferred implementation, the said activating gas generator 18, 52 may be integrated directly to a wire dispenser 62 at the material dispensing station 27. FIG. 3 is an enlarged view of a portion of a die attachment apparatus according to the third preferred embodiment of the invention, wherein an activating gas generator 18 is installed onto a wire dispenser 62.

Along with the activated forming gas, excited hydrogen ions are introduced and sprayed onto a dispensing zone to cover not only bond pads of the substrate 14 where solder is to be dispensed, but also a solder dot 32 or solder pattern that has been dispensed onto the substrate 14. The heated substrate 14 is transported to the material dispensing station 27, and the oxide (for instance, copper oxide) present on the substrate 14 is reduced immediately by the activated forming gas 24. At the same location, the solder dot 32 that has been dispensed onto the bond pad of the substrate 14 is also deoxidized. A single activating gas generator 18 may therefore deoxidize both the substrate 14 and the solder dot 32 simultaneously in this embodiment. The clean bonding solder 38 with good wetting on the cleaned substrate 14 will create a solder bond with the desired bonding performance.

The excited forming gas can be used to handle various types of packages, including single-row or multi-row lead frames and other substrates. The activating gas generator 18, 52 is positionable on the heat tunnel cover 12 relative to the lead frames to reduce all units positioned on the same column, each column being perpendicular to a direction of conveyance of the lead frames. The activating gas generator 18, 52 should preferably at least be movable perpendicularly to the direction of conveyance of the substrate 14 inside the heat tunnel 11. A slidable cover 26, 60 is connected to the activating gas generator 18, 52 and is utilized to cover the opening in the heat tunnel cover 12. It is further adapted to move together with the activating gas generator 18, 52 during such positioning. The slidable cover 26, 60 is especially useful to minimize the leakage of activated forming gas 24, 58 from the heat tunnel when the activating gas generator 18, 52 is used to handle multi-row packages or devices.

Figure 4:
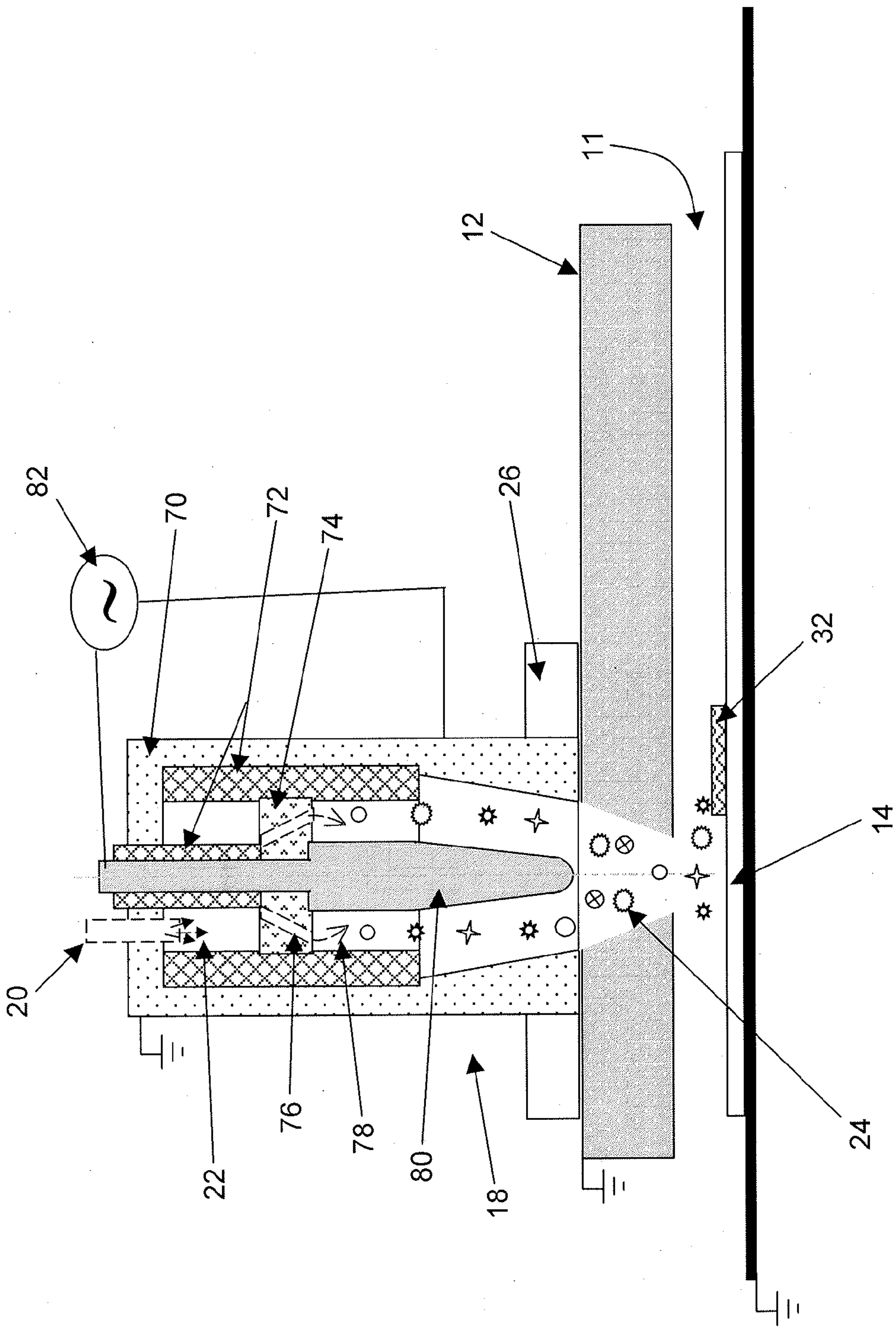
FIG. 4 is an embodiment of an activating gas generator that is usable with the apparatus according to the first and second preferred embodiments of the invention.

FIG. 4 is an embodiment of an activating gas generator 18, 52 that is usable with the apparatus as described in the first and second preferred embodiments of the invention. Specifically, the activating gas generator 18, 52 functions to excite hydrogen ions in the forming gas.

The activating gas generator 18, 52 comprises a first electrode in the form of a central cylindrical electrode 80, a gas swirler 74, a dielectric material 72, and a second electrode comprising a generator holder 70 and/or the heat tunnel cover 12. This gas swirler 74 would serve to make the forming gas 22 swirl with circumferential distribution via a plurality of gas swirler holes 76. The first and second electrodes are operative to create an electric field.

In the embodiment, an alternating electric field is provided in the activating gas generator 18, 52 to excite the hydrogen gas. The activating gas generator 18 is connected to the heat tunnel 11. The alternating electrical field is produced from an apparatus comprising the cone-shaped central cylindrical electrode 80 which is electrically conductive and protrusive, and has a high surface curvature. The central cylindrical electrode 80 is partially surrounded by the dielectric material 72 at its upper portion, which is in turn surrounded by the electrically conductive generator holder 70. At its lowest point, the central cylindrical electrode 80 is located next to the opening in the heat tunnel cover 12 which opens into the heat tunnel 11. The said generator holder 70 and heat tunnel cover 12 are electrically connected to an alternating electrical supply 82. The second electrode comprised in the generator holder 70 encircles the central cylindrical electrode 80 and is grounded (see FIG. 4). The frequency of the alternating electrical supply 82 is not specifically restricted, but may range from 10 kHz to 20 MHz, with a range of 10 to 50 kHz being preferred. An alternating current with a voltage of 100V to 50 kV, more preferably 1 kV to 10 kV, has proven to be particularly advantageous for carrying out the processes according to the invention.

A thin gap is formed between the central cylindrical electrode 80 and the dielectric material 72, and between the dielectric material 72 and the second electrode comprising the generator holder 70, respectively. The dielectric material 72 between the two electrodes is polarized to provide an electric field. An alternating electric field is also created at the bottom of the activating gas generator 18 between heat tunnel cover 12 and the central electrode 80. The forming gas is swirled first by a gas swirler 74 and then the swirled gas 78 is passed through the alternating electric field downwards into the heat tunnel 11 at high speed. The hydrogen gas included in the gas mixture is activated at least partially to become reactive radicals, and then it enters into the chamber of the heat tunnel 11 for cleaning purposes.

The central cylindrical electrode 80 is arranged next to the nozzle of the activating gas generator 18 with a predetermined distance between the tip of the central cylindrical electrode 80 and the surface of the substrate 14 or the solder dot 32 to be cleaned. The distance is determined relative to a diameter of the central electrode, and the distance may be 0.1 to 5 times of the diameter of the central electrode, with the range of 0.5 to 3 times being preferred. The gap between the central cylindrical electrode 80 and the second electrode or the dielectric material 72, which comprises an alternating electrical field, may be from 1 mm to 20 mm, with a range of 5 mm to 10 mm being preferred. At the outlet of the activating gas generator 18, 52, the opening in the heat tunnel cover 12 has a large diameter so as to slow a speed of the activated forming gas 24, 58 which enters the heat tunnel 11 and is sprayed onto the substrate 14 and the solder dot 32 respectively, in order to avoid any damage, particularly to the melted solder.

After being ejected from the gas swirler 74, hydrogen gas is further excited at least partially when it is passing though the alternating electric field generated by the low frequency alternating electrical supply 82 having a frequency of 10-50 kHz or an RF source between the central cylindrical electrode 80 and the second electrode comprised in the generator holder 70 and/or heat tunnel cover 12. The excited hydrogen species may further be comprised in a gas mixture including molecules, atoms, non-hydrogen ions, and other reactive matter. The reactive matter is transmitted through the opening in the heat tunnel cover 12 into the heat tunnel 11, and acts on the substrate 14 and/or solder 32, which has been grounded.

Figure 5A:
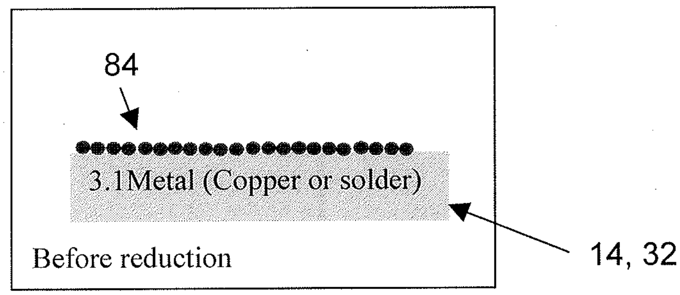
FIGS. 5(*a*)-5(*c*) are schematic illustrations of the removal of oxides after reduction with the cleaning process according to the preferred embodiments of the invention.
Figure 5B:
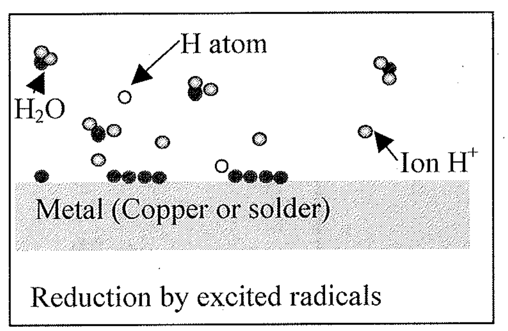
Figure 5C:
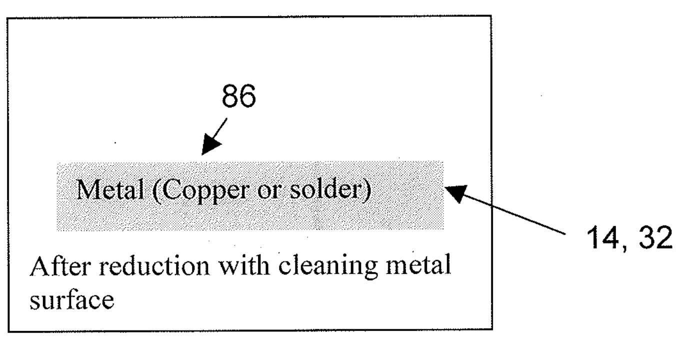

FIGS. 5(*a*)-5(*c*) are schematic illustrations of the removal of oxides after reduction with the cleaning process according to the preferred embodiments of the invention. Before treatment, a metal oxide layer 84 lies on a surface of a substrate 14 or solder dot 32 (see FIG. 5(*a*)). Activated radicals react efficiently with metal oxide (MO) at the high temperatures to reduce it into pure metal and gaseous water that may be exhausted from heat tunnel, as shown in FIG. 5(*b*).

The active radicals are plasma-like particles containing atomic, ionic and discharged hydrogen, and other reactive matter. They are produced in situ, and act on the surfaces of the substrate 14 or solder dot 32. The excited radicals are very reactive and their density is very high, at as much as 100 to 1000 times as compared to thermally decompounded particles in conventional soft solder die bonding.

It is believed that the reduction of oxide occurs as follows:

Dissociative: $n$H2->H2*(excited molecular)+2H(excited atomic)+2H(ionic)+2$e'$

Oxide Reduction: 2H(+)+MO->H2O(Gaseous)+M (where M=solder or copper).

FIG. 5(*c*) indicates that, after reduction, a cleaned metal surface 86 with good wettability results.

Described herein is thus an apparatus and method for removing metal oxides (MO) from substrates 14 and/or solder 32 by means of an activating gas generator 18, 52. The activated radicals may be created and then directly introduced into a heat tunnel 11 of a die attachment apparatus 10, 50, 60 to deoxidize metallic surfaces such as copper and solder surfaces. The active radicals are excited at atmospheric pressure from forming gas, which are passed at high speed through a strong electric field generated by radio waves from an electrical generator. The excited radicals may also be created by electrical discharge enwrapped relative to a dielectric barrier.

The gas mixture generally comprises hydrogen as the reducing gas and nitrogen as the carrier due to the latter's relatively lower cost and the environmental friendliness of the exhaust gas that is released. The carrier gas can also include, but is not limited to, helium and argon. In the described embodiments, the gas mixture may comprise 0.1 to 15% by volume of hydrogen, and more preferably between 3% and 5% by volume of hydrogen; the mixture gas flow may be introduced at a pressure from 0.1-0.5 Mpa, but more preferably from 0.2-0.4 Mpa.

The invention described herein is susceptible to variations, modifications and/or additions other than those specifically described and it is to be understood that the invention includes all such variations, modifications and/or additions which fall within the spirit and scope of the above description.

The invention claimed is:

1. A die attachment apparatus for attaching a semiconductor die onto a substrate having a metallic surface, the apparatus comprising:

- a heat tunnel through which the substrate is configured to be conveyed for the attachment of the semiconductor die to the substrate;
- a heat tunnel cover for closing the heat tunnel;
- a material dispensing station for dispensing a bonding material onto the substrate;
- a die attachment station for placing the semiconductor die onto the bonding material which has been dispensed onto the substrate; and
- an activating gas generator operable for exciting forming gas at atmospheric pressure, the activating gas generator being positioned over and directly in contact with the heat tunnel cover, before the die attachment station, and over an opening in the heat tunnel cover which extends entirely through the heat tunnel cover, for spraying activated forming gas which has been excited at atmospheric pressure through the opening and directly onto the substrate in the heat tunnel, the activated forming gas being operative to reduce oxides on the substrate;
- wherein the activating gas generator is movable perpendicularly to a direction of conveyance of the substrate inside the heat tunnel.

2. The die attachment apparatus as claimed in claim 1, wherein the heat tunnel is filled with shielding gas and closed with a heat tunnel cover for containing the substrate when the substrate is undergoing processing at the respective stations.

3. The die attachment apparatus as claimed in claim 1, further comprising a slidable cover that is connected to and is movable with the activating gas generator, the slidable cover being operative to minimize the leakage of activated forming gas from the heat tunnel through the opening.

4. The die attachment apparatus as claimed in claim 1, wherein the opening in the heat tunnel cover has a sufficiently large diameter to slow a speed of the activated forming gas emerging from the activating gas generator into the heat tunnel.

5. The die attachment apparatus as claimed in claim 1, wherein the activating gas generator comprises a first gas generator positioned before the material dispensing station and/or a second gas generator positioned between the material dispensing station and the die attachment station.

6. The die attachment apparatus as claimed in claim 5, wherein the first gas generator is operative to reduce oxides on the substrate at least at a location on the substrate where an amount of bonding material is to be dispensed, and the second gas generator is operative to reduce oxides on the amount of bonding material that has been dispensed onto the substrate.

7. The die attachment apparatus as claimed in claim 1, wherein the activating gas generator is positioned at the material dispensing station.

8. The die attachment apparatus as claimed in claim 7, wherein the activating gas generator is installed onto a material dispenser located at the material dispensing station, the activating gas generator being operative to introduce activated forming gas both at least at parts of the substrate where the bonding material is to be dispensed, and to introduce activated forming gas onto bonding material that has been dispensed at said parts of the substrate.

9. The die attachment apparatus as claimed in claim 1, wherein the activating gas generator comprises a first electrode and a second electrode for creating an electric field, and a gas swirler comprising a plurality of gas swirling holes for swirling gas passing through the electric field with circumferential distribution.

10. The die attachment apparatus as claimed in claim 9, wherein the first electrode comprises a cone-shaped cylindrical electrode which is electrically conductive and protrusive.

11. The die attachment apparatus as claimed in claim 10, wherein at its lowest point, the cone-shaped cylindrical electrode is located next to an opening in a heat tunnel that is operative to contain the substrate during processing at the respective stations.

12. The die attachment apparatus as claimed in claim 10, further comprising a dielectric material located between the cone-shaped cylindrical electrode and a holder of the activating gas generator, the dielectric material being polarized to provide the electric field.

13. The die attachment apparatus as claimed in claim 10, wherein the second electrode is connected to an alternating electrical supply and comprises a holder for the activating gas generator and/or a heat tunnel cover for closing a heat tunnel that is operative to contain the substrate during processing of the substrate at the respective stations.

14. The die attachment apparatus as claimed in claim 13, wherein the alternating electrical supply has a frequency of 10 kHz to 20 MHz, and a voltage of 100V to 50 kV.

15. The die attachment apparatus as claimed in claim 1, wherein the activated forming gas is excited by the activating gas generator to create an activated species and/or excited radicals for reducing oxides.

16. The die attachment apparatus as claimed in claim 1, wherein the activated forming gas comprises an activated hydrogen species that is activated to form plasma-like particles containing atomic, ionic and discharged hydrogen and other reactive matter.

17. The die attachment apparatus as claimed in claim 4, wherein the opening in the heat tunnel cover is tapered so as to become narrower from the outside to the inside of the heat tunnel cover.

18. A die attachment apparatus for attaching a semiconductor die onto a substrate having a metallic surface, the apparatus comprising:

a heat tunnel through which the substrate is configured to be conveyed for the attachment of the semiconductor die to the substrate;

a heat tunnel cover for closing the heat tunnel;

a material dispensing station for dispensing a bonding material onto the substrate;

a die attachment station for placing the semiconductor die onto the bonding material which has been dispensed onto the substrate; and an activating gas generator operable for exciting forming gas at atmospheric pressure, the activating gas generator being positioned over and directly in contact with the heat tunnel cover, before the die attachment station, and over an opening in the heat tunnel cover which extends entirely through the heat tunnel cover, for spraying activated forming gas which has been excited at atmospheric pressure through the opening and directly onto the substrate in the heat tunnel, the activated forming gas being operative to reduce oxides on the substrate;

wherein the activating gas generator is movable transversely along the heat tunnel cover, at least perpendicularly to a direction of conveyance of the substrate inside the heat tunnel.

* * * * *